US006828246B2

(12) United States Patent
Tu et al.

(10) Patent No.: US 6,828,246 B2
(45) Date of Patent: Dec. 7, 2004

(54) GAS DELIVERING DEVICE

(75) Inventors: An-Chun Tu, Taipei (TW); Wen-Fa Tai, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 234 days.

(21) Appl. No.: 10/152,225

(22) Filed: May 20, 2002

(65) Prior Publication Data

US 2002/0134309 A1 Sep. 26, 2002

Related U.S. Application Data

(62) Division of application No. 09/191,203, filed on Nov. 12, 1998, now abandoned.

(30) Foreign Application Priority Data

Aug. 27, 1998 (TW) .......................................... 87114165 A

(51) Int. Cl.[7] ....................... C23C 16/00; H01L 21/461; H01L 21/469; H01L 21/306
(52) U.S. Cl. ....................... 438/710; 438/689; 438/758; 427/248.1; 427/458; 216/58; 216/71; 118/715; 156/345.33; 156/345.34
(58) Field of Search ..................... 118/715; 156/345.33, 156/345.34; 427/248.1, 458, 569; 216/58, 71; 438/689, 710, 758

(56) References Cited

U.S. PATENT DOCUMENTS

| 5,268,034 | A | * | 12/1993 | Vukelic ...................... 118/715 |
| 5,453,124 | A | * | 9/1995 | Moslehi et al. ............. 118/715 |
| 5,532,190 | A | * | 7/1996 | Goodyear et al. ........... 438/710 |
| 5,552,017 | A | * | 9/1996 | Jang et al. ................... 118/715 |
| 5,781,693 | A | * | 7/1998 | Ballance et al. ............ 392/416 |
| 5,976,261 | A | * | 11/1999 | Moslehi et al. ............. 118/719 |
| 6,294,026 | B1 | * | 9/2001 | Roithner et al. ............ 118/719 |
| 2001/0050051 | A1 | * | 12/2001 | Tu et al. ...................... 118/715 |
| 2002/0134309 | A1 | * | 9/2002 | Tu et al. ...................... 118/715 |

FOREIGN PATENT DOCUMENTS

EP 0181624 * 5/1986 ........... C23C/16/44

OTHER PUBLICATIONS

Perry's Chemical Engineer's Handbook, Flow Measurements, Section 22–20: 22–28, Mc–Graw Hill, 1963.*

* cited by examiner

Primary Examiner—Jeffrie R. Lund
(74) Attorney, Agent, or Firm—Blakely Sokoloff Taylor & Zafman

(57) ABSTRACT

A gas delivering device inside a gaseous reaction chamber capable of increasing gas flow in areas having a deficient supply of gas by forming additional holes in corresponding positions. Because a gas-delivering panel design having asymmetrical holes is employed, gas flow rate within the reactions chamber can be roughly balanced. Hence, a homogeneous stream of gaseous reactants can be maintained above the surface of a reacting wafer.

6 Claims, 2 Drawing Sheets

GAS DELIVERING DEVICE

CROSS-REFERENCE TO RELATED APPLICATION

This application is a divisional of U.S. patent application Ser. No. 09/191,203, filed Nov. 12, 1998 now abandoned and claims the priority benefit of Taiwan application serial no 87114165, filed Aug. 27, 1998, the full disclosure of which is incorporated herein by reference.

BACKGROUND OF THE INVENTION

1. Field of Invention

The present invention relates to a gas-delivering device installed within a semiconductor reaction chamber. More particularly, the present invention relates to a gas-delivering device that can be used for balancing gas flow rate inside the reaction chamber according to the conditions within the chamber.

2. Description of Related Art

As IC fabrication is now in the sub-micron range and processing diameter of a silicon wafer continues to increase, how to establish a highly uniform plasma atmosphere in a reaction chamber is of growing importance. Ultimate uniformity of a processed wafer and microloading effect are closely related to the uniformity of plasma within a reaction chamber. The so-called microloading effect refers to the difference in etching rate or depositing rate in an etching operation or thin film production that results from a variation of exposed area due to a specific pattern distribution. Consequently, in semiconductor manufacturing operations such as etching or layer deposition, a system capable of providing a uniform supply of gases source is very important.

FIG. 1 is a cross-sectional view showing the layout of a conventional reaction chamber. As shown in FIG. 1, a gas-delivering panel 110 and a negative electrode are located inside a reaction chamber 100. The gas-delivering panel 110 can be fixed to the ceiling of the reaction chamber 100, while a wafer 120 can be placed on top of the negative electrode. The reaction chamber 100 has an exhaust outlet connected to a pump via a throttle valve. When the pump is in operation, gases within the chamber 100 are sucked out to maintain a high degree of vacuum within the reaction chamber 100. Furthermore, when a thin film deposition or an etching operation is performed, gaseous reactants can flow into the reaction chamber 100 through the gas-delivering panel 110 so that appropriate reactions with the wafer 120 can take place within the chamber. Structural details of the gas-delivering panel can be seen in FIGS. 2A and 2B.

FIGS. 2A and 2B are the top views of two types of conventional gas-delivering panel installed on the ceiling of the reaction chamber as shown in FIG. 1. As shown in FIGS. 2A and 2B, the gas-delivering panels 110 have a circular plate-like structure with a plurality of symmetrically positioned holes 112. Here, the symmetry point is the center of the circular plate-like structure. Because the gas-delivering panel 110 is installed on the ceiling of the reaction chamber 100, gases coming down from the holes 112 are able to react with the wafer 120 (FIG. 1) in etching or film growing operations.

Since the gas-delivering panel 110 is fixed in position on the ceiling of the reaction chamber 100, gases diffusing down through the symmetrical holes 112 ought to be able to form a uniform layer of gas above the wafer. However, in practice, gas flow within the chamber is highly asymmetrical due to the asymmetrical nature of the fixtures within the reaction chamber 100. Therefore, non-uniformity of gas flow or even a turbulent gas flow is the norm, especially when the pump is operating to create a vacuum. Under such circumstances, uniformity of wafer deposition or etching is affected and microloading effect intensifies. Consequently, product yield is lower and die quality deteriorates.

In light of the foregoing, there is a need to provide a gas-delivering panel structure capable of smoothing the flow of gaseous reactants within the reaction chamber.

SUMMARY OF THE INVENTION

Accordingly, the present invention is to provide a gas-delivering device capable of balancing the gas flow rate directed towards a wafer surface according to the actual conditions within the chamber. Hence, a uniform flow of gaseous reactants is delivered to a wafer surface for carrying out various types of reactions.

To achieve these and other advantages and in accordance with the purpose of the invention, as embodied and broadly described herein, the invention provides a gas-delivering device for a reaction chamber. The gas-delivering device comprises a panel that includes holes drilled in it such that a greater number of holes is formed in places where gas flow is weak. Since the holes are distributed asymmetrically around the gas-delivering panel, more gases can be diverted to chamber areas where the gas flow rate is deficient. Therefore, gaseous reactants can be more uniformly spread inside the reaction chamber.

Actual position of the asymmetrically placed holes depends very much on the actual gas flow conditions within the reaction chamber. In general, asymmetrical hole patterns are formed near places where the gas flow rate is small or air pressure is low. Consequently, a larger volume of gas can flow into these gas deficient areas, thereby homogenizing the gaseous distribution inside the chamber.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
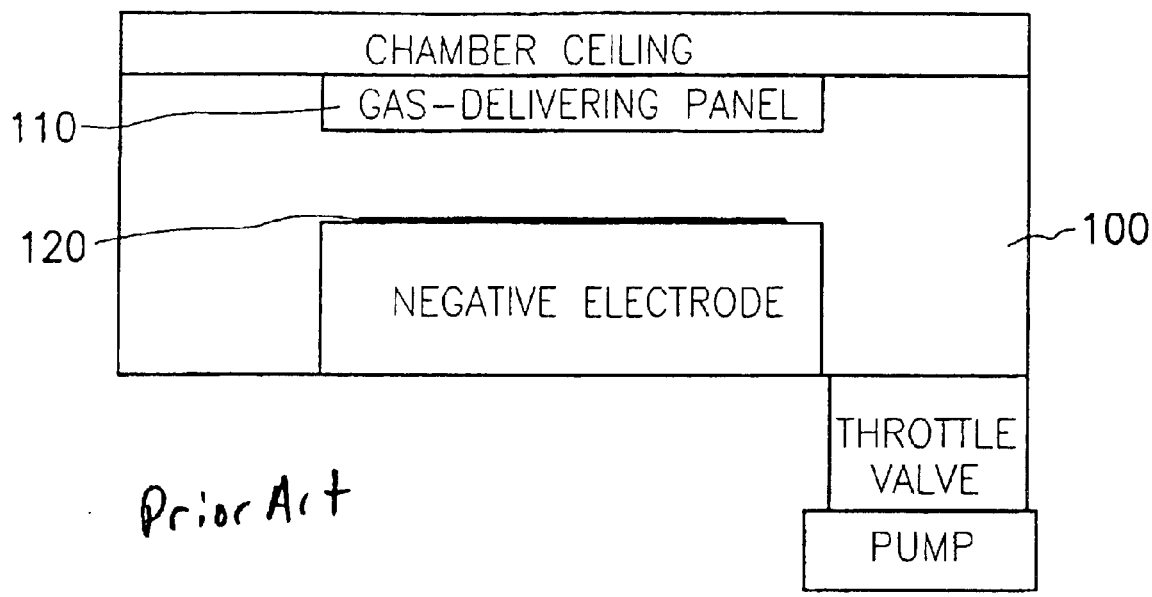
FIG. 1 is a cross-sectional view showing the layout of a conventional reaction chamber.
Figure 2A:
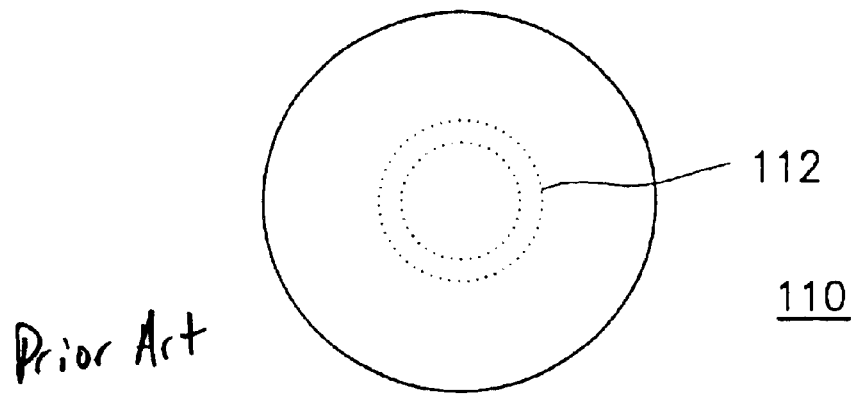
FIGS. 2A and 2B are the top views of two types of conventional gas-delivering panel installed on the ceiling of the reaction chamber as shown in FIG. 1.
Figure 2B:
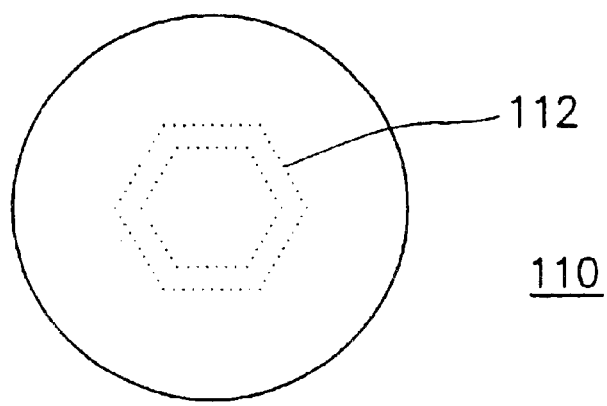

Reference will now be made in detail to the present preferred embodiments of the invention, examples of which are illustrated in the accompanying drawings. Wherever possible, the same reference numbers are used in the drawings and the description to refer to the same or like parts.

This invention provides a gas-delivering device capable of adjusting the gas flow rate into a reaction chamber according to the actual gas flow conditions inside the reaction chamber. Consequently, a uniform flow of gas is delivered to the reacting surface of the wafer, and a high-quality wafer operation can be conducted.

Principally, the invention relies on forming a greater number of holes in areas where flow of gas inside a reaction chamber is weak. Because the gas-delivering panel has an asymmetrical distribution of holes, areas where gas flow is deficient can be compensated for by forming more holes. Normally, gas flow is deficient in places such as the outlet port of the pump or its adjacent sides. Therefore, layout of the holes depends very much on the actual chamber design. Moreover, the layout of holes may be dependent upon the properties of gaseous plasma used in a particular reaction.

Figure 3A:
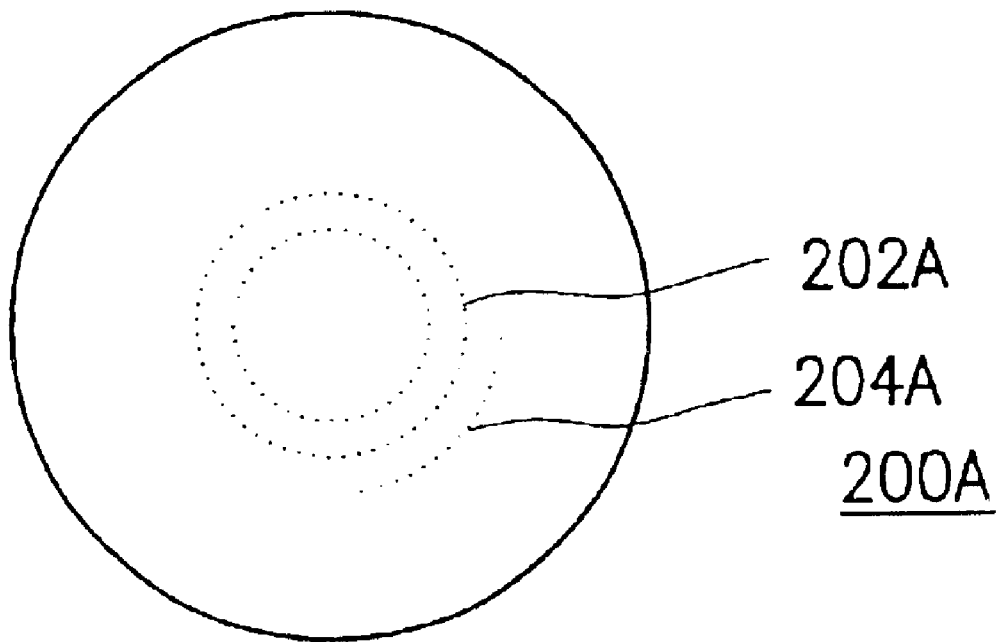
FIGS. 3A and 3B are top views showing the distribution of holes of two types of gas-delivering panel according to this invention.
Figure 3B:
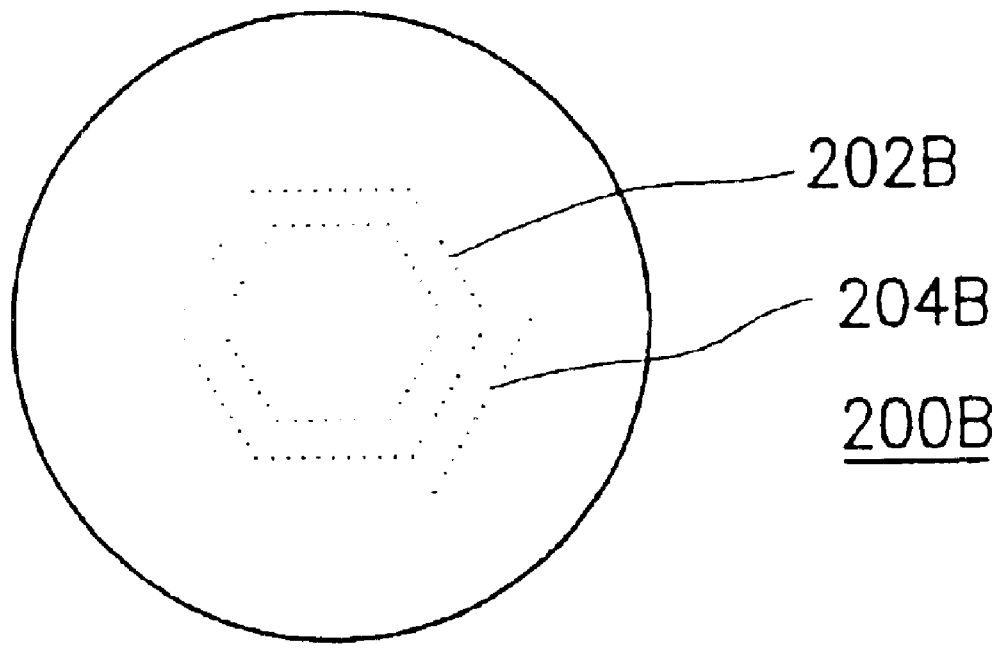

FIGS. 3A and 3B are top views showing the distribution of holes of two types of gas-delivering panel according to this invention.

First, as shown in FIG. 3A, besides the symmetrically distributed holes 202A around the center of the gas-delivering panel 200A, an arc of holes 204A is formed at one corner sector. Hence, an asymmetrical distribution of holes is created. The holes 204A are positioned according to the actual flow of gas with the reaction chamber. For example, the holes are placed near areas where the gas flow rate is slow or gas pressure is low. Consequently, those "weak" areas can be compensated for by the extra gas flow from the extra holes 204A, and hence a more homogeneous distribution of gas is achieved.

In another embodiment as shown in FIG. 3B, besides the symmetrically distributed hexagonal pattern of holes 202B around the center of the gas-delivering panel 200B, a bank of holes 204B is formed not far from one side of the polygon. Hence, an asymmetrical distribution of holes is created. The holes 204B are positioned according to the actual flow of gas within the reaction chamber. For example, the holes are placed near areas where the gas flow rate is slow or gas pressure is low. Consequently, those "weak" areas can be compensated for by the extra gas flow from the extra holes 204B, and hence a more homogeneous distribution of gas is achieved.

In summary, the asymmetrically-placed holes on the gas-delivering panel as shown in FIGS. 3A and 3B are formed in positions where the gas flow rate is deficient. Through careful adjustment of the number and position of those holes, a homogeneous gas flow is obtained. Therefore, wafer reaction within the chamber can be carried out in a uniform environment.

Obviously, asymmetrical distribution of holes should not be restricted to the configuration shown in FIG. 3A or FIG. 3B. In practice, the asymmetrical holes can be placed anywhere according to the design of a particular reaction chamber or the particular properties of gaseous plasma.

Hence, the advantages of using asymmetrical holes compared with the conventional symmetrical holes includes:

1. The asymmetrical holes can rectify any odd type of reaction chamber design immediately and boost the efficiency of the hardware. Therefore, IC processing becomes more stable.
2. The asymmetrical holes can compensate for any intrinsic asymmetrical gas flow within the chamber due to any structural asymmetry. Therefore, difference in processing parameters between different reaction chambers can be greatly reduced.
3. Homogeneity of wafer reaction can be increased considerably.
4. Asymmetrical hole design can save developing time and cost compared with a conventional gas-delivering panel having symmetrical holes.
5. The invention is able to reduce developing time for new processing operations.
6. A more homogeneous stream of gaseous reactants is produced for carrying out wafer reaction. Hence, existing limits in wafer processing operations can be relaxed and the efficiency of wafer reaction station is thus improved.

Although a circular type of gas-delivering panel is used throughout the aforementioned illustration, the panel is by no means restricted to such a geometric shape. Anybody familiar with the technologies should be able to provide panels having other geometric shapes that can perform the same function equally within the scope of this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a gas delivery structure located inside a reaction chamber, wherein the reaction chamber has an exhaust-outlet pump, an electrode, a gas delivering panel above the electrode, the method comprising:

placing a wafer in the reaction chamber;

activating the exhaust-outlet pump so that gases within the reaction chamber can be sucked out; and delivering a plasma gas through the gas delivering panel, wherein the gas delivering panel has a first group of holes symmetrically positioned relative to a center of the gas delivering panel, and a second group of holes positioned near a periphery of the first group of holes to form an asymmetrical pattern relative to the center of the gas delivering panel.

2. The method of claim 1, comprising arranging the second group of holes to be positioned above the areas where the gas flow rate is low within the chamber.

3. The method of claim 1, comprising arranging the first group of holes to be concentric circles, and the second group of holes to be positioned on a perimeter of the first group of holes.

4. The method of claim 1, comprising arranging the second group of holes to be positioned on a perimeter of the first group of symmetrically positioned holes.

5. The method of claim 1, comprising arranging the first group of holes to be polygons, and the second group of holes to be positioned on a perimeter of the first group of holes.

6. The method of claim 1, wherein the second group of holes is positioned within a portion of the periphery of the first group of holes.

* * * * *